(12) United States Patent
Kure et al.

(10) Patent No.: US 11,664,249 B2
(45) Date of Patent: May 30, 2023

(54) SUBSTRATE PROCESSING APPARATUS, SUBSTRATE PROCESSING METHOD, AND RECORDING MEDIUM

(71) Applicant: TOKYO ELECTRON LIMITED, Tokyo (JP)

(72) Inventors: Seiichi Kure, Kumamoto (JP); Ryouichirou Naitou, Kumamoto (JP); Hideo Shite, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 762 days.

(21) Appl. No.: 16/692,152

(22) Filed: Nov. 22, 2019

(65) Prior Publication Data
US 2020/0090967 A1 Mar. 19, 2020

Related U.S. Application Data

(63) Continuation of application No. 15/681,494, filed on Aug. 21, 2017, now abandoned.

(30) Foreign Application Priority Data

Aug. 23, 2016 (JP) ................................ 2016-162916

(51) Int. Cl.
*H01L 21/67* (2006.01)
*G03F 7/30* (2006.01)
(Continued)

(52) U.S. Cl.
CPC .......... *H01L 21/67225* (2013.01); *G03F 7/16* (2013.01); *G03F 7/30* (2013.01);
(Continued)

(58) Field of Classification Search
CPC ........... H01L 21/67225; H01L 21/0274; H01L 21/31; H01L 21/67017; H01L 21/67069;
(Continued)

(56) References Cited

U.S. PATENT DOCUMENTS

| 5,134,962 A | 8/1992 | Amada et al. |
| 10,734,251 B2* | 8/2020 | Takayanagi ....... H01L 21/67017 |

(Continued)

FOREIGN PATENT DOCUMENTS

| JP | 2002-075957 A | 3/2002 |
| JP | 2007-234862 A | 9/2007 |

(Continued)

*Primary Examiner* — Hung V Nguyen
(74) *Attorney, Agent, or Firm* — Jerald L. Meyer; Tanya E. Harkins

(57) ABSTRACT

A substrate processing apparatus includes a nozzle for discharging a processing solution, a processing solution supply part for supplying the processing solution to the nozzle and a controller. The processing solution supply part includes a tank, a first conduit for guiding the processing solution from the tank to the nozzle, a pump installed in the first conduit, and a filter having first and second spaces, and a filtering member for separating between the first space and the second space. The controller performs a first control process of controlling the processing solution supply part to flow the processing solution from the first space to the second space through the filtering member by the pump, and after the first control process, a second control process of controlling the processing solution supply part to flow the processing solution from the second space to the first space through the filtering member by the pump.

12 Claims, 10 Drawing Sheets

(51) Int. Cl.
*G03F 7/16* (2006.01)
*H01L 21/027* (2006.01)
*H01L 21/31* (2006.01)

(52) U.S. Cl.
CPC .......... *H01L 21/0274* (2013.01); *H01L 21/31* (2013.01); *H01L 21/6715* (2013.01); *H01L 21/67017* (2013.01); *H01L 21/67069* (2013.01); *H01L 21/67161* (2013.01); *H01L 21/67253* (2013.01)

(58) Field of Classification Search
CPC ........... H01L 21/6715; H01L 21/67161; H01L 21/67253; H01L 21/027; H01L 21/67011; H01L 21/02052; H01L 21/02307; H01L 21/02343; G03F 7/16; G03F 7/30
See application file for complete search history.

(56) References Cited

U.S. PATENT DOCUMENTS

| | | | |
|---|---|---|---|
| 2014/0174475 A1 | 6/2014 | Takayanagi et al. | |
| 2015/0331322 A1 | 11/2015 | Carcasi et al. | |
| 2020/0316654 A1* | 10/2020 | Jhuan | H01L 21/67051 |

FOREIGN PATENT DOCUMENTS

| | | |
|---|---|---|
| JP | 2014-140001 A | 7/2014 |
| KR | 10-2014-0080423 A | 6/2014 |

\* cited by examiner

SUBSTRATE PROCESSING APPARATUS, SUBSTRATE PROCESSING METHOD, AND RECORDING MEDIUM

CROSS-REFERENCE TO RELATED APPLICATION

This is a Continuation Application of U.S. patent application Ser. No. 15/681,494, filed Aug. 21, 2017, now abandoned, which is an application claiming the benefit of priority from Japanese Patent Application No. 2016-162916, filed on Aug. 23, 2016, the entire contents of each of which are incorporated herein by reference.

TECHNICAL FIELD

The present disclosure relates to a substrate processing apparatus, a substrate processing method, and a non-transitory computer-readable recording medium.

BACKGROUND

In the related art, a solution processing apparatus includes a processing solution container in which a processing solution is stored, a discharge nozzle for discharging the processing solution, a supply conduit installed to connect between the processing solution container and the discharge nozzle, a filter installed in the supply conduit, a pump installed in a supply conduit at a secondary side of the filter, and a return conduit installed to connect between a discharge side of the pump and a primary side of the filter.

SUMMARY

Some embodiments of the present disclosure provide a substrate processing apparatus, a substrate processing method, and a non-transitory computer-readable recording medium which are effective in suppressing the clogging of a filter caused by a processing solution.

According to one embodiment of the present disclosure, there is provided a substrate processing apparatus including: a nozzle configured to discharge a processing solution; a processing solution supply part configured to supply the processing solution to the nozzle; and a controller, wherein the processing solution supply part includes: a tank in which the processing solution is received; a first conduit configured to guide the processing solution from the tank to the nozzle; a pump installed in the first conduit; and a filter installed in the first conduit between the tank and the pump and having a first space defined at the side of the tank, a second space defined at the side of the pump, and a filtering member configured to separate between the first space and the second space, and the controller is configured to perform: a first control process of controlling the processing solution supply part to flow the processing solution from the first space to the second space through the filtering member by the pump; and after the first control process, a second control process of controlling the processing solution supply part to flow the processing solution from the second space to the first space through the filtering member by the pump.

According to another embodiment of the present disclosure, there is provided a method of processing a substrate using a substrate processing apparatus which is provided with a nozzle configured to discharge a processing solution and a processing solution supply part configured to supply the processing solution to the nozzle, the processing solution supply part including a tank in which the processing solution is received, a first conduit configured to guide the processing solution from the tank to the nozzle, a pump installed in the first conduit, and a filter installed in the first conduit between the tank and the pump and having a first space defined at the side of the tank, a second space defined at the side of the pump, and a filtering member configured to separate between the first space and the second space, the method including: flowing the processing solution from the first space to the second space through the filtering member by the pump; and after the flowing the processing solution from the first space to the second space through the filtering member, directing the processing solution from the second space to the first space through the filtering member by the pump.

According to another embodiment of the present disclosure, there is provided a non-transitory computer-readable recording medium having a program recorded therein for causing an apparatus to execute the aforementioned method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
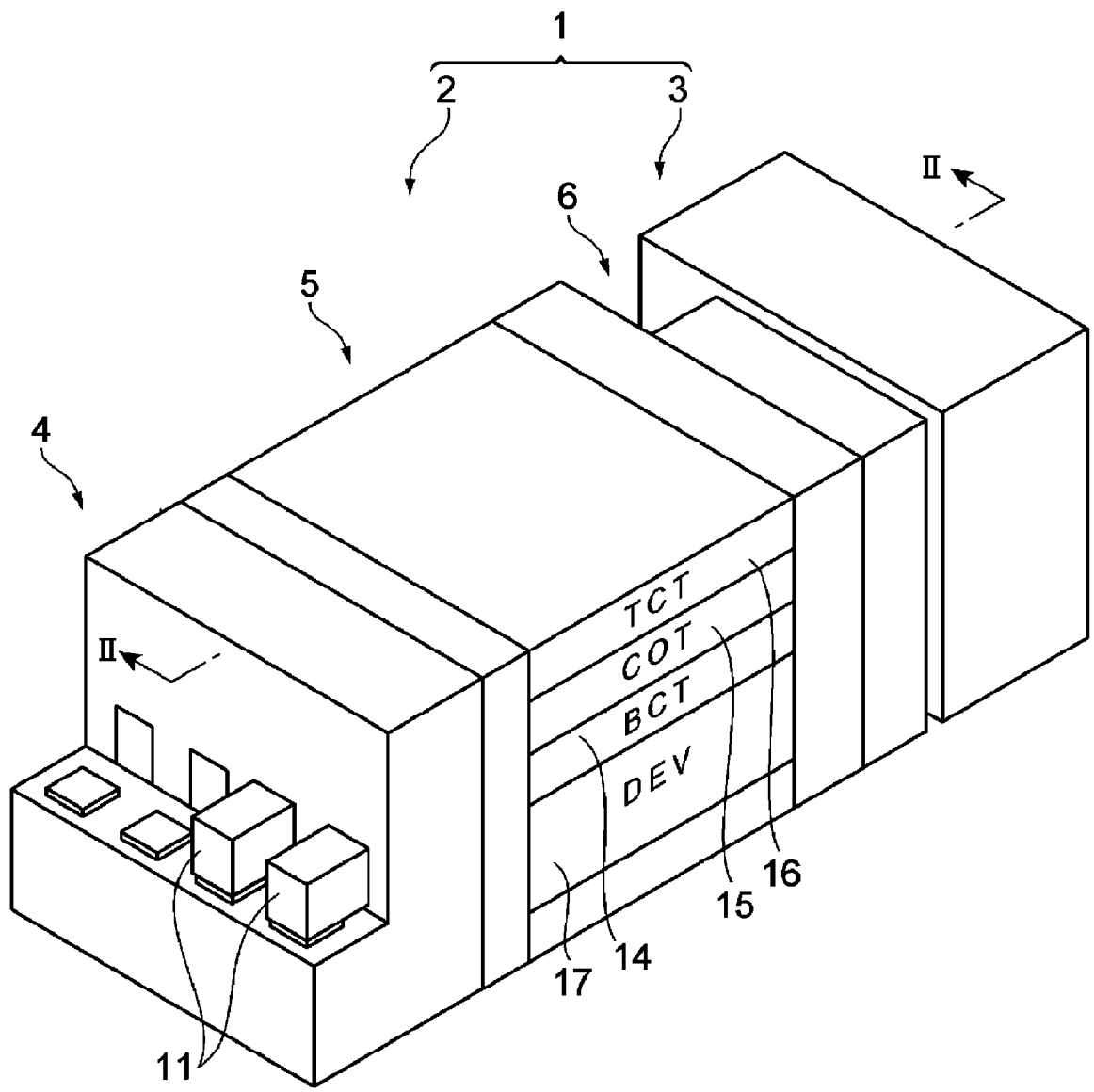
FIG. 1 is a perspective view of a substrate processing system.

Hereinafter, embodiments will be described in detail with reference to the accompanying drawings. In the description, identical elements or elements having the same function are provided with identical reference numerals, and repetitive explanation thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Substrate Processing System]

The substrate processing system 1 is a system for forming a photosensitive film on a substrate, exposing the photosensitive film to light, and developing the photosensitive film. The substrate to be processed is, for example, a semiconductor wafer W. The photosensitive film is, for example, a photoresist film.

The substrate processing system 1 includes a coating/developing apparatus 2 and an exposing apparatus 3. The exposing apparatus 3 performs an exposing process on a photoresist film formed on a wafer W. Specifically, the exposing apparatus 3 irradiates energy rays to an exposure target portion of the photoresist film by a method such as a liquid immersion lithography. The coating/developing apparatus 2 forms the photoresist film on a surface of the wafer W before the exposing process by the exposing apparatus 3, and develops the photoresist film after the exposing process.

(Coating/Developing Apparatus)

Figure 2:
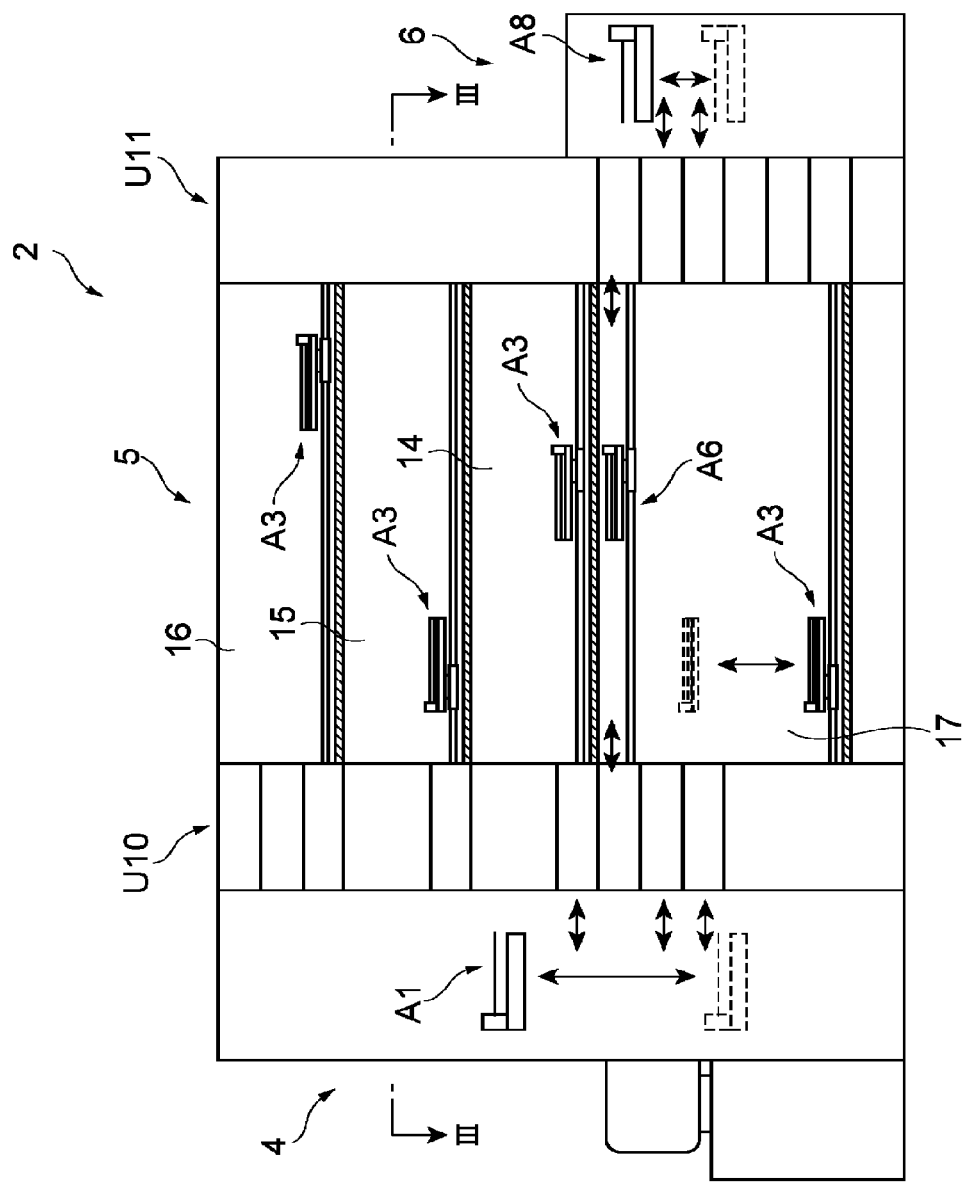
FIG. 2 is a sectional view taken along line II-II of FIG. 1.
Figure 3:
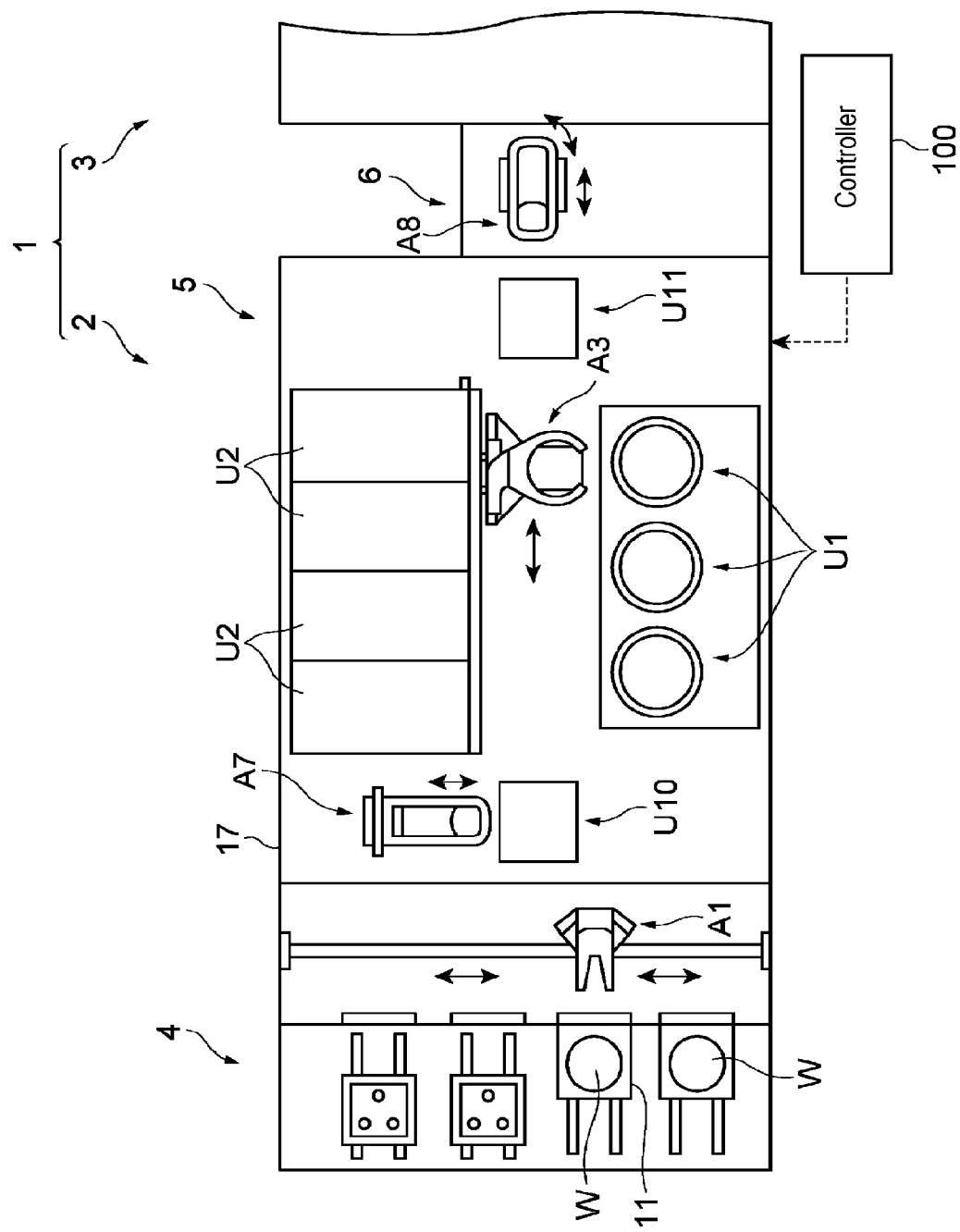
FIG. 3 is a sectional view taken along line of FIG. 2.

Hereinafter, a configuration of the coating/developing apparatus 2 will be described as an example of the substrate processing apparatus. As illustrated in FIGS. 1 to 3, the coating/developing apparatus 2 includes a carrier block 4, a processing block 5, an interface block 6, and a controller 100.

The carrier block 4 carries the wafer W into the coating/developing apparatus 2 and carries the wafer W out of the coating/developing apparatus 2. For example, the carrier block 4 is configured to support a plurality of carriers 11 for wafers W, and incorporates a transfer arm A1 therein. Each of the carriers 11 receives, for example, a plurality of circular wafers W therein. The transfer arm A1 extracts a wafer W from the carrier 11 to deliver the same to the processing block 5, and receives the wafer W from the processing block 5 to return the same to the carrier 11.

The processing block 5 includes a plurality of processing modules 14, 15, 16, and 17. As illustrated in FIGS. 2 and 3, each of the processing modules 14, 15, 16, and 17 includes a plurality of solution processing units U1, a plurality of heat treatment units U2, and a transfer arm A3 for transferring the wafers W to these units. The processing module 17 further includes a direct transfer arm A6 for transferring the wafer W while bypassing the solution processing units U1 and the heat treatment units U2. Each of the solution processing units U1 applies a processing solution to the surface of the wafer W. Each of the heat treatment units U2 includes, for example, a heating plate and a cooling plate installed therein, and performs a heat treatment on the wafer W by heating the wafer W using the heating plate and then cooling the heated wafer W using the cooling plate.

The processing module 14 forms a lower layer film on the surface of the wafer W by the solution processing units U1 and the heat treatment units U2. The solution processing units U1 of the processing module 14 apply a processing solution for forming the lower layer film onto the wafer W. The heat treatment units U2 of the processing module 14 perform various types of heat treatments involved in the formation of the lower layer film.

The processing module 15 forms a photoresist film on the lower layer film by the solution processing units U1 and the heat treatment units U2. The solution processing units U1 of the processing module 15 apply a processing solution for forming the photoresist film onto the lower layer film. The heat treatment units U2 of the processing module 15 perform various types of heat treatments involved in the formation of the photoresist film.

The processing module 16 forms an upper layer film on the photoresist film by the solution processing units U1 and the heat treatment units U2. The solution processing units U1 of the processing module 16 apply a processing solution for forming the upper layer film onto the photoresist film. The heat treatment units U2 of the processing module 16 perform various types of heat treatments involved in the formation of the upper layer film.

The processing module 17 develops the photoresist film after exposure by the solution processing units U1 and the heat treatment units U2. The solution processing units U1 of the processing module 17 develop the photoresist film by applying a processing solution for development (a developing solution) onto the surface of the wafer W which has been subjected to the exposing process, and then cleaning the processing solution with a processing solution for cleaning (a rinse solution). The heat treatment units U2 of the processing module 17 perform various types of heat treatments involved in the development process. Specific examples of the heat treatments may include a heat treatment before development (post exposure bake (PEB)), a heat treatment after development (post bake (PB)) and the like.

A shelf unit U10 is installed within the processing block 5 so as to be adjacent to the carrier block 4. The shelf unit U10 is divided into a plurality of cells arranged in the vertical direction. A lifting arm A7 is installed near the shelf unit U10. The lifting arm A7 vertically moves the wafer W between the cells of the shelf unit U10. A shelf unit U11 is installed within the processing block 5 so as to be adjacent to the interface block 6. The shelf unit U11 is divided into a plurality of cells arranged in the vertical direction.

The interface block 6 transfers the wafer W between the coating/developing apparatus 2 and the exposing apparatus 3. For example, the interface block 6 includes a transfer arm A8 installed therein and is connected to the exposing apparatus 3. The transfer arm A8 delivers the wafer W received in the shelf unit U11 to the exposing apparatus 3 and receives the wafer W from the exposing apparatus 3 to return the same to the shelf unit U11.

The controller 100 controls the coating/developing apparatus 2 to perform a coating/developing process, for example, in the following sequence.

The controller 100 controls the transfer arm A1 to transfer the wafer W received in the carrier 11 to the shelf unit U10 and controls the lifting arm A7 to place the respective wafer W in a cell for the processing module 14.

The controller 100 controls the transfer arm A3 to transfer the wafer W received in the shelf unit U10 to the solution processing unit U1 and the heat treatment unit U2 in the processing module 14, and controls the solution processing unit U1 and the heat treatment unit U2 to form a lower layer film on the surface of the wafer W. Thereafter, the controller 100 controls the transfer arm A3 to return the wafer W having the lower layer film formed thereon to the shelf unit U10, and controls the lifting arm A7 to place the respective wafer W in a cell for the processing module 15.

Subsequently, the controller 100 controls the transfer arm A3 to transfer the wafer W received in the shelf unit U10 to the solution processing unit U1 and the heat treatment unit U2 in the processing module 15, and controls the solution processing unit U1 and the heat treatment unit U2 to form a photoresist film on the lower layer film of the wafer W. Thereafter, the controller 100 controls the transfer arm A3 to return the wafer W to the shelf unit U10, and controls the lifting arm A7 to place the wafer W in a cell for the processing module 16.

The controller 100 controls the transfer arm A3 to transfer the wafer W received in the shelf unit U10 to each of the solution processing unit U1 and the heat treatment unit U2 in the processing module 16, and controls the solution processing unit U1 and the heat treatment unit U2 to form an upper layer film on the photoresist film of the wafer W. Thereafter, the controller 100 controls the transfer arm A3 to return the wafer W to the shelf unit U10, and controls the lifting arm A7 to place the wafer W in a cell for the processing module 17.

The controller 100 controls the direct transfer arm A6 to transfer the wafer W received in the shelf unit U10 to the shelf unit U11, and controls the transfer arm A8 to transfer the wafer W to the exposing apparatus 3. Thereafter, the controller 100 controls the transfer arm A8 to receive, from the exposing apparatus 3, the wafer W which has been subjected to the exposing process, and to return the wafer W to the shelf unit U11.

The controller 100 controls the transfer arm A3 to transfer the wafer W received in the shelf unit U11 to each of the solution processing unit U1 and the heat treatment unit U2 in the processing module 17, and controls the solution processing unit U1 and the heat treatment unit U2 to develop the photoresist film formed on the wafer W. Thereafter, the controller 100 controls the transfer arm A3 to return the wafer W to the shelf unit U10, and controls the lifting arm A7 and the transfer arm A1 to return the wafer W into the carrier 11. In this manner, the coating/developing process is completed.

The specific configuration of the substrate processing apparatus is not limited to the configuration of the coating/developing apparatus 2 illustrated above. The substrate processing apparatus is not particularly limited as long as they include solution processing units for forming a film (the solution processing units U1 of each of the processing modules 14, 15, and 16) and a controller capable of controlling the solution processing units may be used as the substrate processing apparatus.

(Solution Processing Unit)

Figure 4:
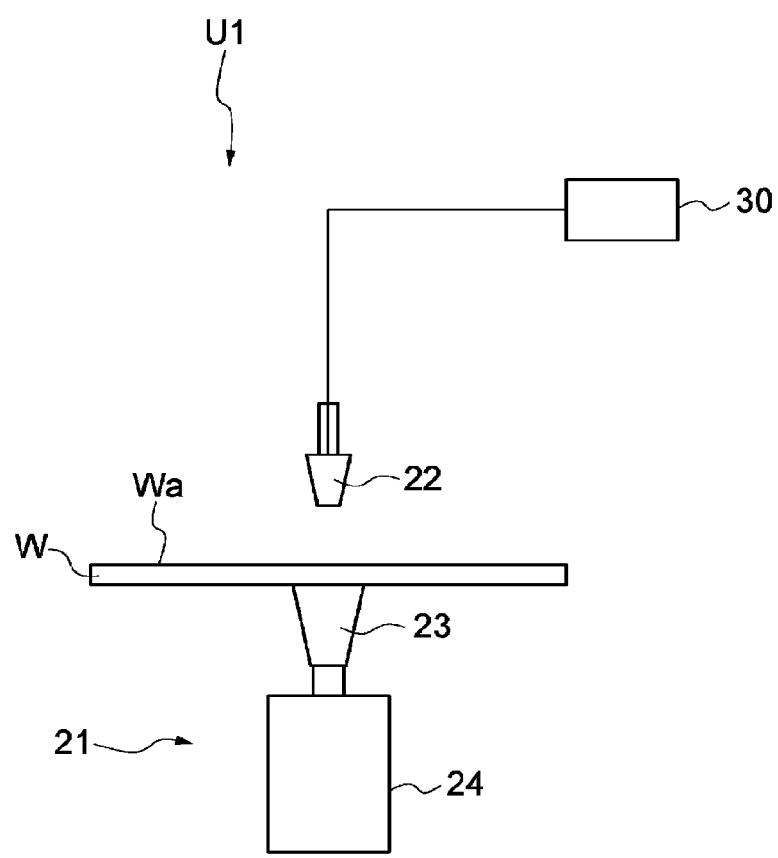
FIG. 4 is a schematic view of a coating unit.

Hereinafter, the solution processing units U1 of the processing module 15 will be described in detail. As illustrated in FIG. 4, each of the solution processing units U1 of the processing module 15 includes a holding/rotating mechanism 21, a nozzle 22, and a processing solution supply part 30.

The holding/rotating mechanism 21 rotates a semiconductor wafer W as an example of the substrate while holding the wafer W. The holding/rotating mechanism 21 includes, for example, a holding part 23 and a rotation driving part 24. The holding part 23 supports the central portion of the horizontally-disposed wafer W with the surface Wa oriented upwards, and holds the wafer W by, for example, vacuum suction. The rotation driving part 24 is an actuator having, for example, an electric motor as a power source, and rotates the holding part 23 and the wafer W about its vertical rotational central axis.

The nozzle 22 sprays a processing solution onto the surface Wa of the wafer W. The processing solution is, for example, a resist solution containing a photosensitive resist material. The nozzle 22 is disposed above the wafer W to spray the processing solution downwards.

Figure 5:
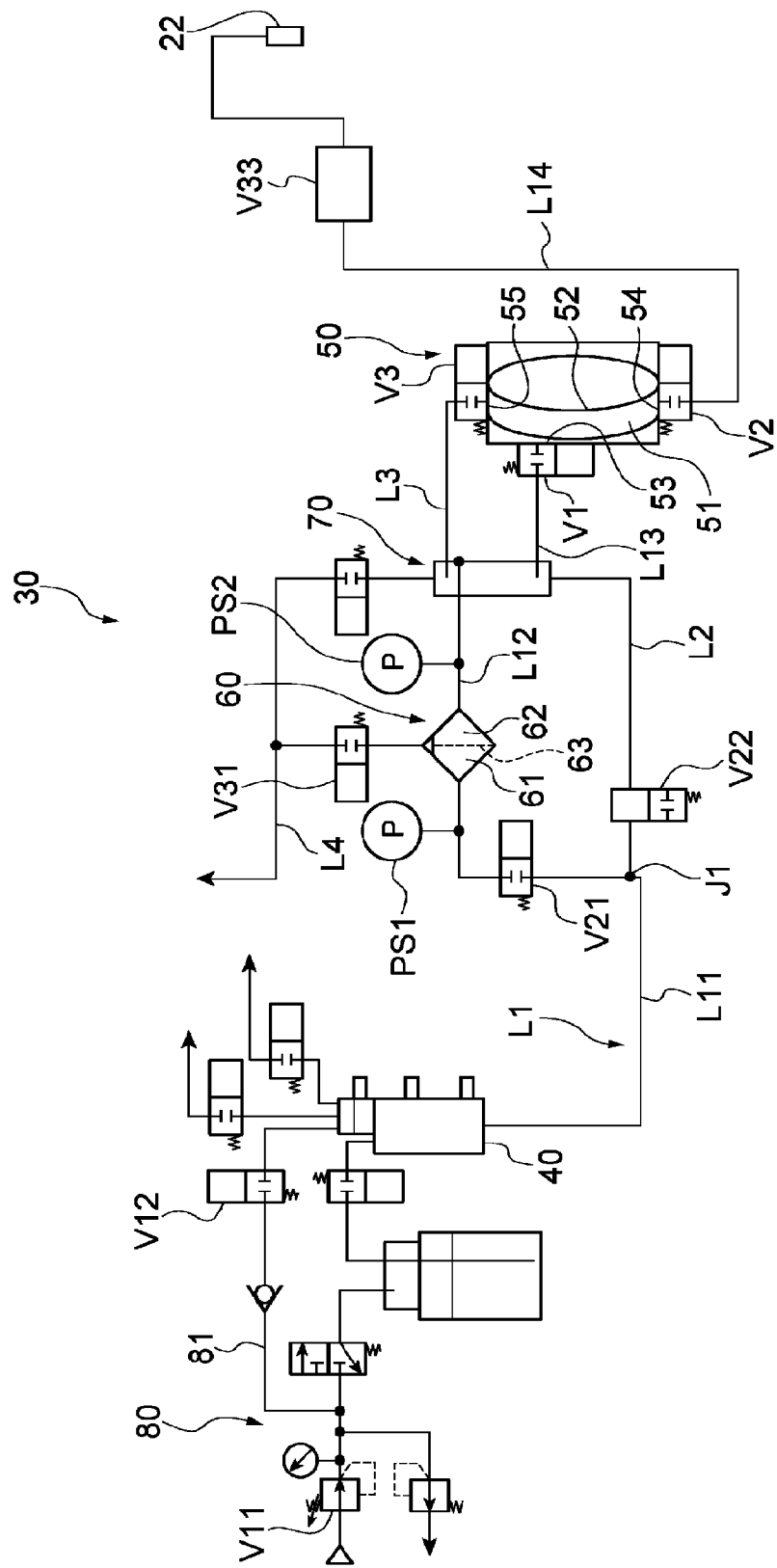
FIG. 5 is a schematic view of a processing solution supply part.

The processing solution supply part 30 supplies the processing solution to the nozzle 22. As illustrated in FIG. 5, the processing solution supply part 30 includes a tank 40, a solution transfer pipe L1, a filter 60, a trap 70, a pump 50, solution transfer pipes L2 and L3, a solution drain pipe L4, a pressurizing part 80, flow path switching valves V21 and V22, a solution drain valve V31, a drain valve V33, and pressure sensors PS1 and PS2.

The tank 40 receives the processing solution. The solution transfer pipe L1 (a first conduit) guides the processing solution from the tank 40 to the nozzle 22. The filter 60, the trap 70, and the pump 50 are installed in the solution transfer pipe L1 while being sequentially arranged in the direction from the tank 40 to the nozzle 22. That is to say, the filter 60 is installed in the solution transfer pipe L1 between the tank 40 and the pump 50. The trap 70 is installed in the solution transfer pipe L1 between the filter 60 and the pump 50. Hereinafter, a portion of the solution transfer pipe L1 between the tank 40 and the filter 60 is referred to as a first portion L11, a portion of the solution transfer pipe L1 between the filter 60 and the trap 70 is referred to as a second portion L12, a portion of the solution transfer pipe L1 between the trap 70 and the pump 50 is referred to as a third portion L13, and a portion of the solution transfer pipe L1 between the pump 50 and the nozzle 22 is referred to as a fourth portion L14.

The filter 60 is installed in the solution transfer pipe L1 between the tank 40 and the pump 50 to remove particles from the processing solution. The filter 60 includes a first space 61 defined at the side of the tank 40, a second space 62 defined at the side of the pump 50, and a filtering member 63 configured to separate between the first space 61 and the second space 62. The first space 61 is connected to the first portion L11 of the solution transfer pipe L1, and the second space 62 is connected to the second portion L12 of the solution transfer pipe L1. The solution drain pipe L4, in addition to the first portion L1, is connected to the first space 61. The solution drain pipe L4 (a fourth conduit) discharges the processing solution within the first space 61. The term "discharge" used herein refers to discharging the processing solution out of the conduit that guides the processing solution in the direction from the tank 40 to the pump 50 or from the pump 50 to the tank 40.

The trap 70 separates gas from the processing solution.

The pump 50 forcibly feeds the processing solution. For example, the pump 50 includes a solution storage chamber 51, a diaphragm 52, an inlet port 53, an outlet port 54, a circulation port 55, an inlet valve V1, an outlet valve V2, and a circulation valve V3. The solution storage chamber 51 stores the processing solution to be forcibly fed. The diaphragm 52 sucks the processing solution into the solution storage chamber 51 by increasing the volume of the solution storage chamber 51, and discharges the processing solution out of the solution storage chamber 51 by decreasing the volume of the solution storage chamber 51.

The inlet port 53 is used to introduce the processing solution into the solution storage chamber 51 from the trap 70. The inlet port 53 is connected to the third portion L13 of the solution transfer pipe L1 and is opened toward the interior of the solution storage chamber 51. The outlet port 54 is used to discharge the processing solution from the solution storage chamber 51 to the nozzle 22. The outlet port 54 is connected to the fourth portion L14 of the solution transfer pipe L1 and is opened toward the interior of the solution storage chamber 51. The circulation port 55 is used to discharge the processing solution from the solution storage chamber 51 to the trap 70. The circulation port 55 is connected to the trap 70 through the solution transfer pipe L3 and is opened toward the interior of the solution storage chamber 51. The solution transfer pipe L3 (a third conduit) guides the processing solution from the solution storage chamber 51 to the trap 70.

The inlet valve V1 opens or closes a flow path of the processing solution through which the processing solution flows from the trap 70 to the pump 50. For example, the inlet valve V1 is installed in the third portion L13 to open or close the flow path in the third portion L13. The inlet valve V1 may be installed at the junction of the third portion L13 and the pump 50 to open or close the inlet port 53.

The outlet valve V2 opens or closes a flow path of the processing solution through which the processing solution flows from the pump 50 to the nozzle 22. For example, the outlet valve V2 is installed in the fourth portion L14 to open or close the flow path in the fourth portion L14. The outlet valve V2 may be installed at the junction of the fourth portion L14 and the pump 50 to open or close the outlet port 54.

The circulation valve V3 opens or closes a flow path of the processing solution through which the processing solution flows from the pump 50 to the trap 70. For example, the circulation valve V3 is installed in the solution transfer pipe L3 to open or close the flow path in the solution transfer pipe L3. The circulation valve V3 may be installed in the junction of the solution transfer pipe L3 and the pump 50 to open or close the circulation port 55.

The inlet valve V1, the outlet valve V2 and the circulation valve V3 are not particularly limited as long as they can open and close respective flow paths. Specific examples of the valves may include an air operation valve or the like.

The pressurizing part 80 applies pressure to the processing solution inside the tank 40 to direct the same toward the pump 50. For example, the pressurizing part 80 includes a pressurization pipe 81, a pressure control valve V11, and a pressurization valve V12. The pressurization pipe 81 connects a pressure source (not shown) and the tank 40. The pressure source discharges an inert gas (for example, a nitrogen gas) for pressurization.

The pressure control valve V11 and the pressurization valve V12 are installed in the pressurization pipe 81 and sequentially arranged in the direction from the pressure source to the tank 40. The pressure control valve V11 controls an internal pressure of the tank 40 by controlling an opening degree of a flow path installed between the pressure source and the tank 40. The pressure control valve V11 is not particularly limited as long as it can control the opening degree of a flow path. Specific examples of the pressure control valve V11 may include an electromagnetic valve or the like. The pressurization valve V12 opens or closes the flow path between the pressure source and the tank 40 to switch between the state in which the pressurizing part 80 applies the pressure to the tank 40 and the state in which the pressurizing part 80 does not apply the pressure to the tank 40. The pressurization valve V12 is not particularly limited as long as it can open and close the flow path. Specific examples of the pressurization valve V12 may include an air operation valve or the like.

The solution transfer pipe L2 (a second conduit) connects between the first space 61 and the second space 62 of the filter 60 while bypassing the filtering member 63 of the filter 60. For example, the solution transfer pipe L2 is branched from the first portion L11 of the solution transfer pipe L1 and is connected to the trap 70. In other words, one end portion of the solution transfer pipe L2 is coupled to the first space 61 through the first portion L11, and the other end portion of the solution transfer pipe L2 is coupled to the second space 62 through the trap 70 and the solution transfer pipe L12. As a result, the first space 61 and the second space 62 are connected with each other while bypassing the filtering member 63. Hereinafter, a portion where the solution transfer pipe L2 is branched from the first portion L11 is referred to as a junction portion J1.

The flow path switching valve V21 is installed in the solution transfer pipe L1 between the junction portion J1 and the filter 60 to open or close the flow path in the solution transfer pipe L1. The flow path switching valve V22 is installed in the solution transfer pipe L2 to open or close a flow path in the solution transfer pipe L2. The flow path switching valves V21 and V22 are not particularly limited as long as they can open and close the flow path. Specific examples of the flow path switching valve V22 may include an air operation valve or the like.

The flow path through which the processing solution flows from the tank 40 to the trap 70 can be switched by the flow path switching valves V21 and V22. For example, when the flow path switching valve V21 is opened and the flow path switching valve V22 is closed, the processing solution can flow from the tank 40 to the trap 70 via the filter 60. In contrast, when the flow path switching valve V22 is opened and the flow path switching valve V21 is closed, the processing solution can flow from the tank 40 to the trap 70 while bypassing the filter 60. Further, when both the flow path switching valves V21 and V22 are opened, the processing solution can flow from the trap 70 to the first space 61 of the filter 60.

The solution drain valve V31 is installed in the solution drain pipe L4 to open or close a flow path in the solution drain pipe L4. Thus, the solution drain valve V31 switches between a state in which the processing solution stored in the first space 61 can be drained and a state in which the processing solution stored in the first space 61 cannot be drained. The solution drain valve V31 is not particularly limited as long as it can open and close the flow path. Specific examples of the solution drain valve V31 may include an air operation valve or the like.

The drain valve V33 is installed in the solution transfer pipe L1 (i.e., the fourth portion L14) between the pump 50 and the nozzle 22 to open or close the flow path in the solution transfer pipe L1. Thus, the drain valve V33 switches between a state in which the processing solution can be drained from the nozzle 22 and a state in which the processing solution cannot be drained from the nozzle 22.

The pressure sensor PS1 detects an internal pressure of the flow path leading from the tank 40 to the first space 61. The expression "leading" used herein means that the flow path is connected to the first space 61 without going through the filtering member 63. For example, the pressure sensor PS1 is installed in the solution transfer pipe L1 between the flow path switching valve V21 and the filter 60 to detect the internal pressure of the solution transfer pipe L1.

The pressure sensor PS2 detects an internal pressure of the flow path leading from the trap 70 to the second space 62. The expression "leading" used herein means that the flow path is connected to the second space 62 without going through the filtering member 63. For example, the pressure sensor PS2 is installed in the solution transfer pipe L1 (i.e., the second portion L12) between the filter 60 and the trap 70 to detect the internal pressure of the solution transfer pipe L1.

(Controller)

The processing solution supply part 30 is controlled by the controller 100 described above. Hereinafter, a configuration of the controller 100 for controlling the processing solution supply part 30 will be described.

The controller 100 is configured to perform a first control process and a second control process. The first control process controls the processing solution supply part 30 to supply the processing solution from the first space 61 to the second space 62 through the filtering member 63 by the pump 50. After the first control process, the second control process controls the processing solution supply part 30 to supply the processing solution from the second space 62 to the first space 61 through the filtering member 63 by the pump 50. The second control process may include discharging the processing solution introduced into the first space 61 from the second space 62 through the filtering member 63 with an increase in the internal pressure of the filter 60. In some embodiments, the controller 100 may be configured to initiate the second control process with an increase in the difference between the internal pressure of the first space 61 and the internal pressure of the second space 62.

In some embodiments, after the processing solution flows from the second space 62 to the first space 61 through the filtering member 63 under the second control process, the controller 100 may be configured to further perform a third control process of controlling the processing solution supply part 30 to guide the processing solution pressurized by the pressurizing part 80 to the second space 62 through the solution transfer pipe L2 and allow the processing solution to flow from the second space 62 to the first space 61 through the filtering member 63. In some embodiments, the third control process may include controlling the processing solution supply part 30 to open the flow path through which the processing solution flows the solution transfer pipe L2 when the internal pressure of the second space 62 is lower than the internal pressure of the tank 40.

In some embodiments, the controller 100 may be configured to further perform a fourth control process of controlling the processing solution supply part 30 to supply the processing solution from the second space 62 to the first space 61 through the filtering member 63 by the pump 50 before the first control process. Further, the controller 100 may be configured to complete the fourth control process with a decrease in the difference between the internal pressure of the first space 61 and the internal pressure of the second space 62.

Figure 6:
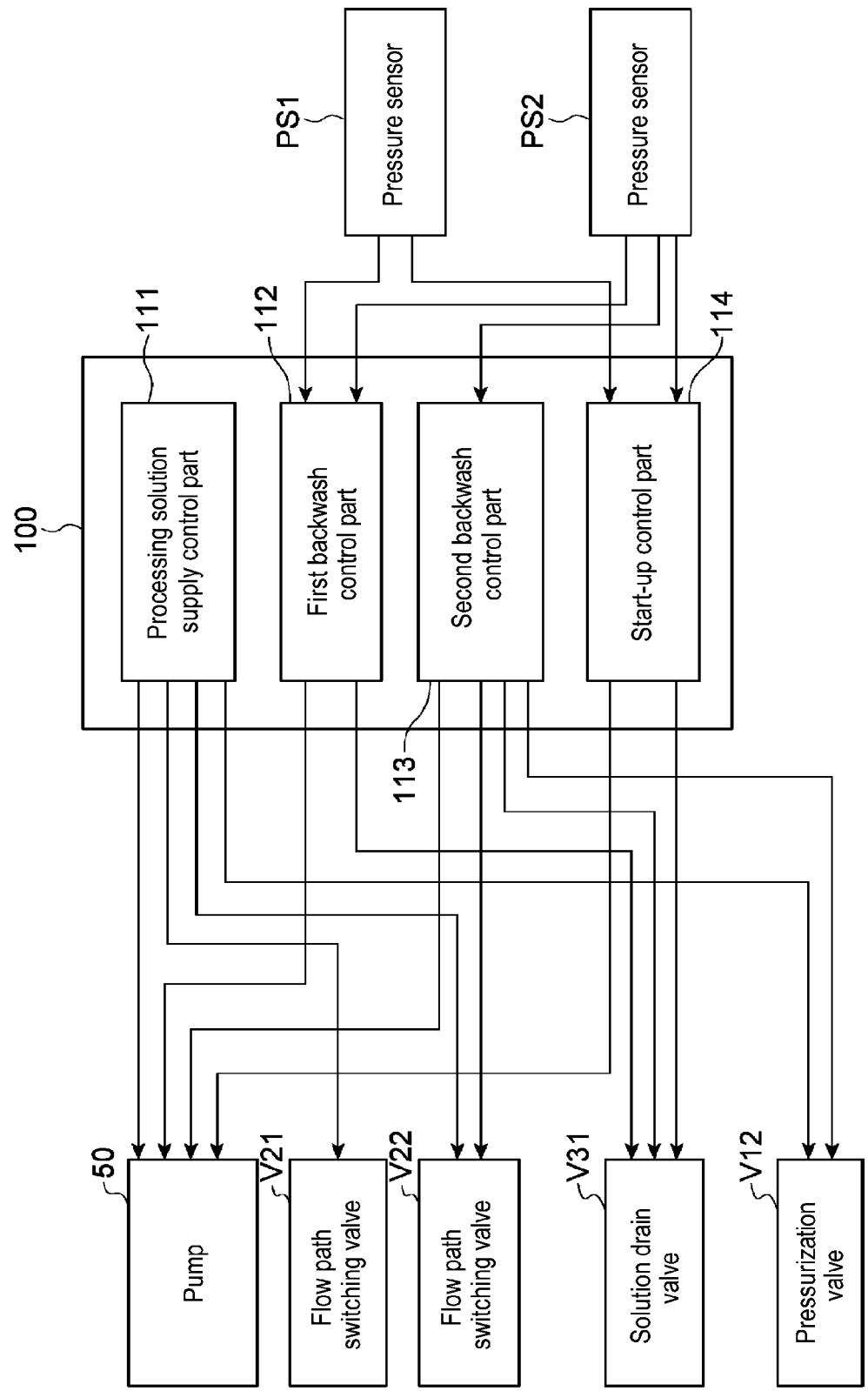
FIG. 6 is a block diagram illustrating a functional configuration of a controller.

As illustrated in FIG. 6, the controller 100 includes a processing solution supply control part 111, a first backwash control part 112, a second backwash control part 113, and a start-up control part 114 as functional modules.

The processing solution supply control part 111 performs a processing solution supply control. The processing solution supply control part 111 performs the processing solution supply control when supplying the processing solution to the surface Wa of the wafer W. The processing solution supply control includes controlling the processing solution supply part 30 to supply the processing solution from the tank 40 to the nozzle 22 through the filter 60 by the pump 50. The processing solution flows from the first space 61 to the second space 62 through the filtering member 63 within the filter 60. That is to say, the processing solution supply control part 111 includes the first control process.

The first backwash control part 112 performs a first backwash control. While the processing solution supply control is being performed, the first backwash control part 112 performs the first backwash control if it is determined that the filter 60 needs to be cleaned. The first backwash control includes controlling the processing solution supply part 30 to flow a processing solution from the second space 62 to the first space 61 through the filtering member 63 by the pump 50. That is to say, the first backwash control includes the second control process.

The second backwash control part 113 performs a second backwash control. The second backwash control part 113 performs the second backwash control after the first backwash control is performed. The second backwash control includes controlling the processing solution supply part 30 to guide a processing solution pressurized by the pressurizing part 80 to the second space 62 through the solution transfer pipe L2 and allow the same to flow from the second space 62 to the first space 61 through the filtering member 63. That is to say, the second backwash control includes the third control process.

The start-up control part 114 performs a start-up control. The start-up control part 114 performs the start-up control after the filtering member 63 of the filter 60 is replaced with a new one and before the processing solution supply control is performed. The start-up control includes controlling the processing solution supply part 30 to flow the processing solution from the second space 62 to the first space 61 through the filtering member 63 by the pump 50. That is to say, the start-up control includes the fourth control process.

Figure 7:
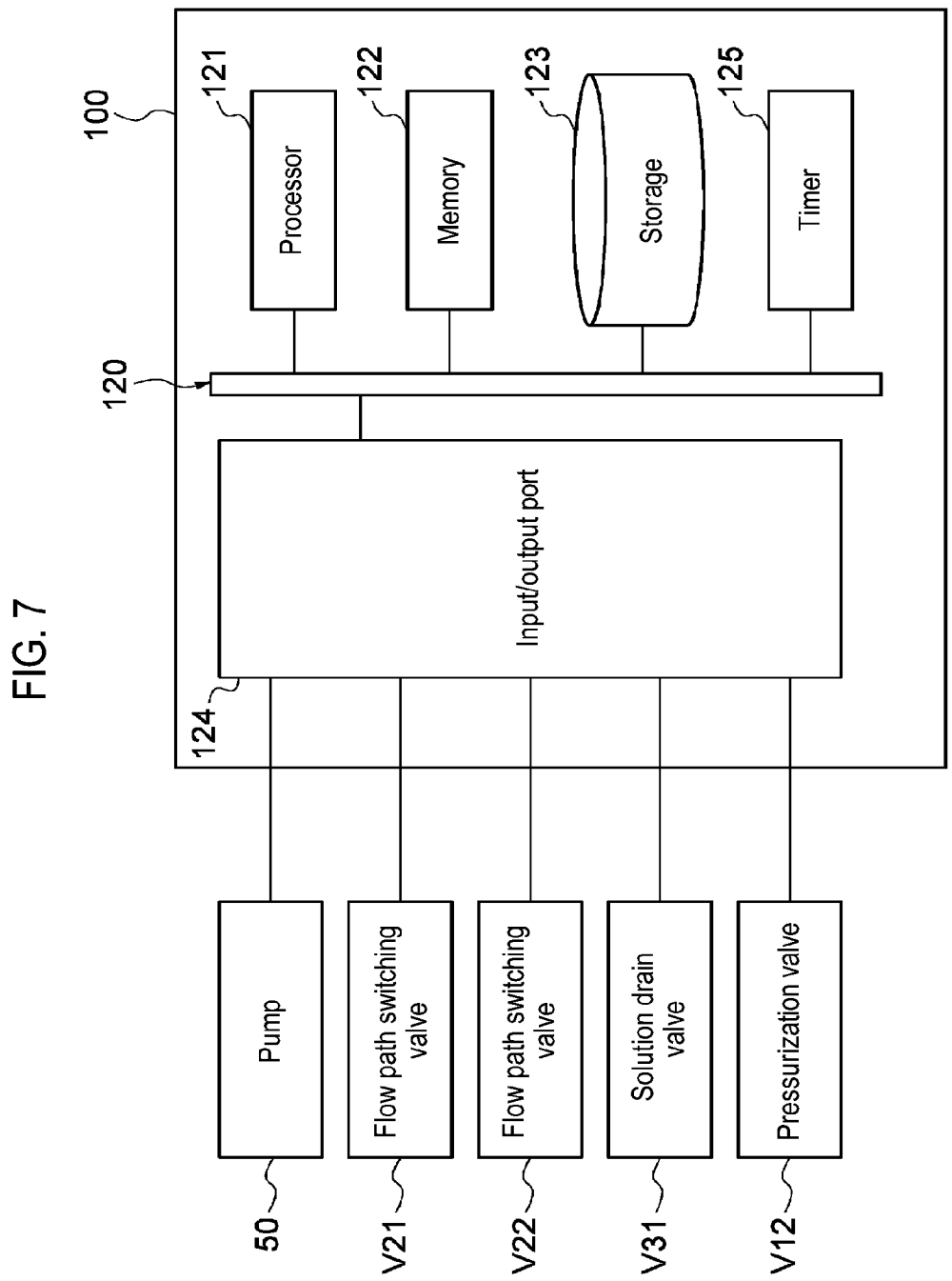
FIG. 7 is a block diagram illustrating a hardware configuration of the controller.

The controller 100 is constituted by one or plural control computers. For example, the controller 100 includes a circuit 120 illustrated in FIG. 7. The circuit 120 includes one or plural processors 121, a memory 122, a storage 123, an input/output port 124, and a timer 125. The input/output port 124 performs an input/output operation of electrical signals between the pump 50, the flow path switching valves V21 and V22, the solution drain valve V31, the pressurization valve V12, and the like. The timer 125 measures an elapsed time by, for example, counting reference pulses for a predetermined period of time.

The storage 123 includes a computer readable recording medium such as, for example, a hard disk drive, etc. The recording medium has a program recorded therein for executing the substrate processing procedure (to be described later) in the carrier block 4 and the processing block 5. The recording medium may be a non-volatile semiconductor memory or an extractable medium such as a magnetic disc, an optical disc or the like. The memory 122 temporarily stores the program loaded from the recording medium of the storage 123 and operation results obtained by the processor 121. The processor 121 executes the program in cooperation with the memory 122 to configure the aforementioned functional modules.

The hardware configuration of the controller 100 is not necessarily limited to configuring the functional modules by the program. For example, each of the functional modules of the controller 100 may be constituted by a dedicated logic circuit or an application specific integrated circuit (ASIC) in which the dedicated logic circuit is integrated.

[Substrate Processing Procedure]

Hereinafter, a processing solution supply procedure, a filter cleaning procedure, and a filter start-up procedure, which are performed by the processing solution supply part 30 under the control of the controller 100, will be described as an example of a substrate processing method.

(Processing Solution Supply Procedure)

Figure 8:
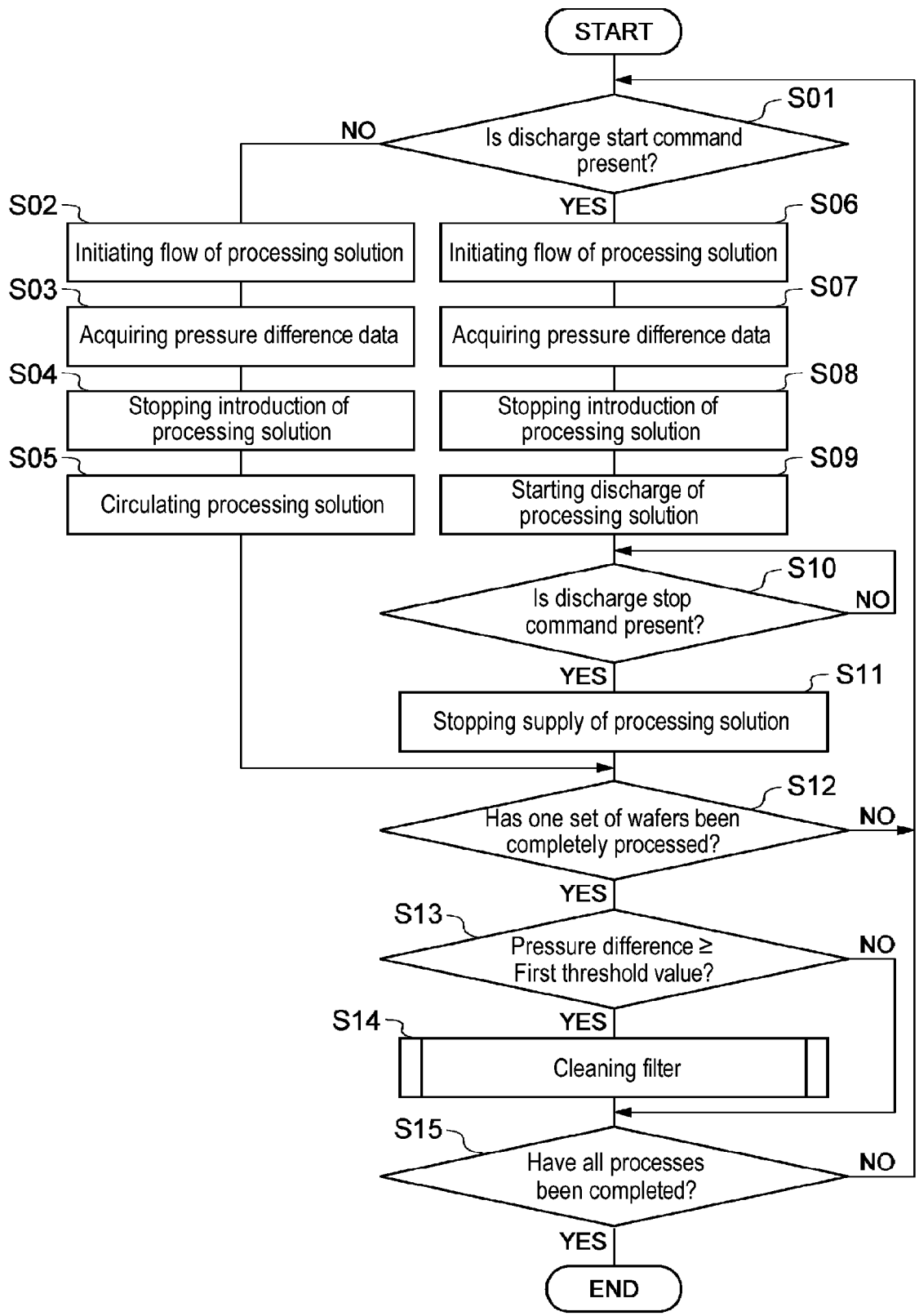
FIG. 8 is a flowchart illustrating a processing solution supply procedure.

As illustrated in FIG. 8, the controller 100 performs step S01 first. In step S01, the processing solution supply control part 111 determines the presence or absence of a discharge start command. The discharge start command may be automatically generated by another functional module of the controller 100, or may be inputted by an operator. For example, the discharge start command is automatically generated after a wafer W is carried into the solution processing unit U1.

If it is determined in step S01 that there is no discharge start command, the controller 100 controls the processing solution supply part 30 to circulate the processing solution between the tank 40 and the pump 50. Specifically, the controller 100 performs steps S02 to S05.

In step S02, the processing solution supply control part 111 controls the processing solution supply part 30 to initiate flow of the processing solution from the tank 40 to the pump 50 through the filter 60 by introducing the processing solution into the solution storage chamber 51 of the pump 50. For example, the processing solution supply control part 111 controls the pump 50 to initiate the introduction of the processing solution into the solution storage chamber 51 with the flow path switching valve V21 opened, the flow path switching valve V22 closed, the solution drain valve V31 closed, the outlet valve V2 and the circulation valve V3 closed, and the inlet valve V1 opened. Accordingly, the processing solution flows from the tank 40 to the pump 50 through the filter 60. The processing solution flows from the first space 61 to the second space 62 through the filtering member 63 within the filter 60. That is to say, step S02 includes the first control process.

In step S03, the first backwash control part 112 acquires data (hereinafter, referred to as a "pressure difference data") related to a difference between the internal pressure of the first space 61 and the internal pressure of the second space 62 in the filter 60. For example, the first backwash control part 112 acquires a difference between a detection value obtained by the pressure sensor PS1 and a detection value obtained by the pressure sensor PS2. The pressure difference data is used in determining whether the filter 60 needs to be cleaned, as will be described below.

In step S04, the processing solution supply control part 111 controls the pump 50 to stop the introduction of the processing solution into the solution storage chamber 51.

In step S05, the processing solution supply control part 111 controls the processing solution supply part 30 to discharge the processing solution stored in the solution storage chamber 51 and flow the same from the pump 50 to the tank 40 through the solution transfer pipe L2. For example, the processing solution supply control part 111 controls the pump 50 to discharge the processing solution stored in the solution storage chamber 51 with the flow path switching valve V21 closed, the flow path switching valve V22 opened, the inlet valve V1 and the outlet valve V2 closed, and the circulation valve V3 opened. Accordingly, the processing solution flows back to the tank 40 through a sequence of the solution transfer pipe L3, the solution transfer pipe L2, and the solution transfer pipe L1.

Subsequently, the controller 100 proceeds to step S12, which will be described below.

If it is determined in step S01 that the discharge start command is present, the controller 100 performs steps S06 to S09. In step S06, the processing solution supply control part 111 controls the processing solution supply part 30 to initiate flow of the processing solution from the tank 40 to the pump 50 through the filter 60 by introducing the processing solution into the solution storage chamber 51 of the pump 50. For example, the processing solution supply control part 111 controls the pump 50 to initiate the introduction of the processing solution into the solution storage chamber 51 with the flow path switching valve V21 opened, the flow path switching valve V22 closed, the solution drain valve V31 closed, the outlet valve V2 and the circulation valve V3 closed, and the inlet valve V1 opened. Accordingly, the processing solution flows from the tank 40 to the pump 50 through the filter 60. The processing solution flows from the first space 61 to the second space 62 through the filtering member 63 within the filter 60. That is to say, step S06 also includes the first control process.

In step S07, the first backwash control part 112 acquires pressure difference data, as in step S03.

In step S08, the processing solution supply control part 111 controls the pump 50 to stop the introduction of the processing solution into the solution storage chamber 51.

In step S09, the processing solution supply control part 111 controls the processing solution supply part 30 to discharge the processing solution stored in the solution storage chamber 51 to supply the processing solution to the nozzle 22. For example, the processing solution supply control part 111 controls the pump 50 to discharge the processing solution stored in the solution storage chamber 51 with the inlet valve V1 and the circulation valve V3 closed, the outlet valve V2 opened, and the drain valve V33 opened. Thus, the processing solution is supplied to the nozzle 22 through the solution transfer pipe L1.

Subsequently, the controller 100 performs step S10. In step S10, the processing solution supply control part 111 stands ready for a discharge stop command. The discharge stop command may be automatically generated by another functional module of the controller 100, or may be inputted by an operator. For example, the discharge stop command is automatically generated when the application of the processing solution on the wafer W is completed, immediately before or immediately after the application.

Subsequently, the controller 100 performs step S11. In step S11, the processing solution supply control part 111 controls the processing solution supply part 30 to stop the supply of the processing solution to the nozzle 22. For example, the processing solution supply control part 111 closes the drain valve V33. Thus, the supply of the processing solution to the nozzle 22 is stopped. Thereafter, the processing solution supply control part 111 controls the processing solution supply part 30 to discharge the processing solution remaining within the solution storage chamber 51 and thus allow the flow of the processing solution from the pump 50 to the tank 40 through the solution transfer pipe L2. For example, the processing solution supply control part 111 controls the pump 50 to discharge the processing solution remaining within the solution storage chamber 51 with the flow path switching valve V21 closed, the flow path switching valve V22 opened, the inlet valve V1 and the outlet valve V2 closed, and the circulation valve V3 opened. Accordingly, the processing solution flows back to the tank 40 through a series of the solution transfer pipe L3, the solution transfer pipe L2, and the solution transfer pipe L1.

Next, the controller 100 performs step S12. In step S12, the processing solution supply control part 111 determines whether the solution process for a set of wafers W has been completed. The set of wafers W may be a single wafer W or a plurality of wafers W. For example, the set of wafers W may be a plurality of wafers W in the same lot, or may be a plurality of wafers W received in one carrier 11.

If it is determined in step S12 that the solution process for the set of wafers W has not been completed, the controller 100 returns to step S01. Thereafter, until the solution process for the set of wafers W is completed, the processing solution is circulated in the case where there is no discharge start command, and the supply of the processing solution to the nozzle 22 is repeated in the case where the discharge start command is present.

If it is determined in step S12 that the solution process for the set of wafers W has been completed, the controller 100 performs step S13. In step S13, the first backwash control part 112 determines whether the pressure difference data (hereinafter, referred to as a "pressure difference") acquired in step S03 or S07 is greater than or equal to a first threshold value. The first threshold value has been set in advance based on the correlation between the pressure difference and the degree to which particles have been accumulated in the filtering member 63. The correlation can be obtained by experiments, simulations, or the like.

If it is determined in step S13 that the pressure difference is not greater than or equal to the first threshold value, the controller 100 proceeds to step S15, which will be described below.

If it is determined in step S13 that the pressure difference is greater than or equal to the first threshold value, the controller 100 performs step S14. In step S14, the first backwash control part 112 and the second backwash control part 113 perform a cleaning process of the filter 60. A specific procedure thereof will be described below.

Subsequently, the controller 100 performs step S15. In step S15, the processing solution supply control part 111 determines whether the solution process for all the wafers W have been completed. If it is determined in step S15 that the solution process for all the wafers W have not been completed, the controller 100 returns to step S01. If it is determined in step S15 that the solution process for all the wafers W have been completed, the controller 100 ends the process.

(Filter Cleaning Procedure)

Figure 9:
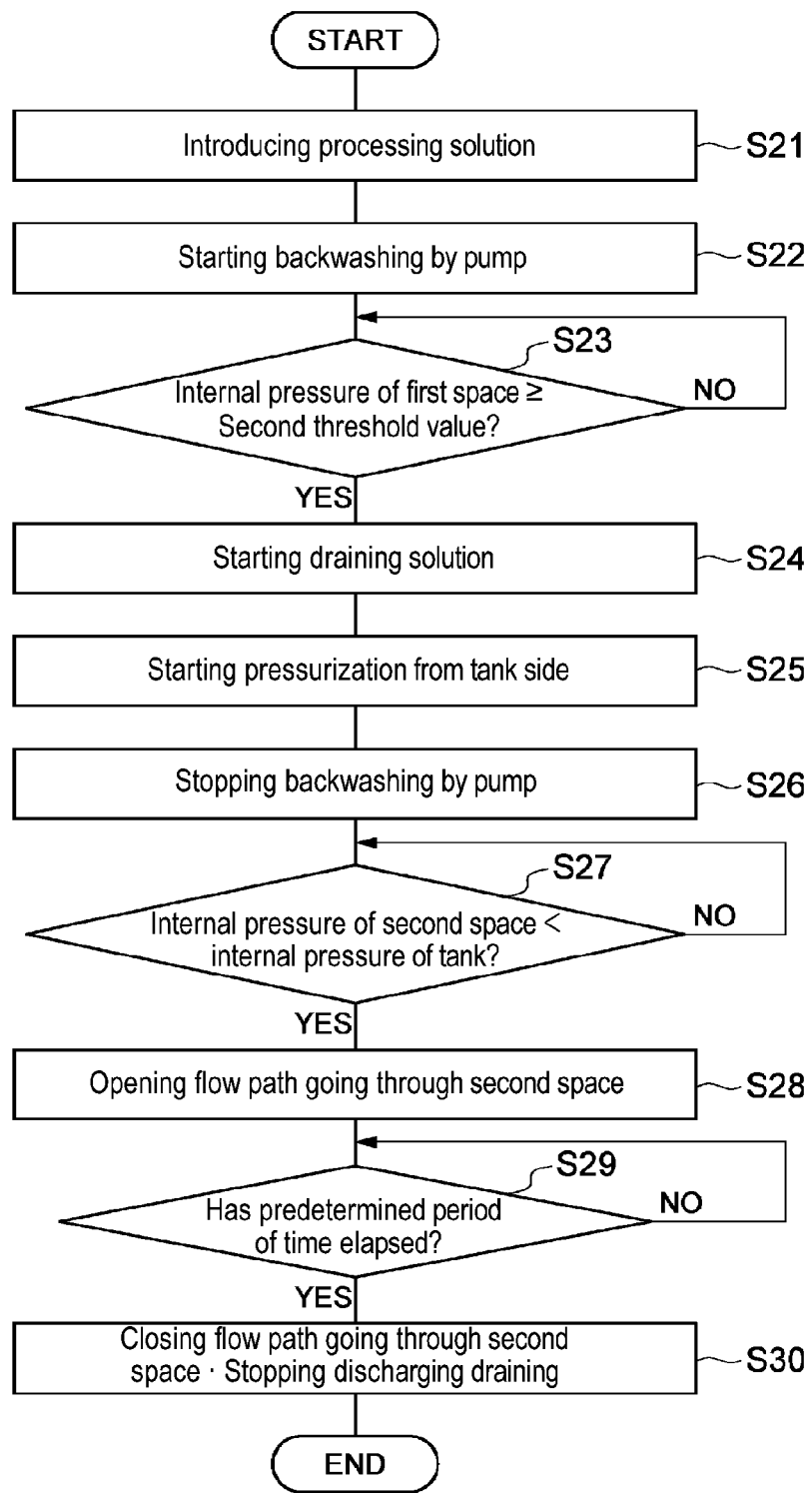
FIG. 9 is a flowchart illustrating a filter cleaning procedure.

Hereinafter, a cleaning procedure of the filter 60 in step S14 will be described in detail. As illustrated in FIG. 9, the controller 100 performs step S21 first. In step S21, the processing solution supply control part 111 controls the processing solution supply part 30 to allow flow of the processing solution from the tank 40 to the pump 50 through the filter 60 by introducing the processing solution into the solution storage chamber 51 of the pump 50. For example, the first backwash control part 112 controls the pump 50 to introduce the processing solution into the solution storage chamber 51 with the flow path switching valve V21 opened, the flow path switching valve V22 closed, the solution drain valve V31 closed, the outlet valve V2 and the circulation valve V3 closed, and the inlet valve V1 opened. Thus, the processing solution flows from the tank 40 to the pump 50 through the filter 60. The processing solution flows from the first space 61 to the second space 62 through the filtering member 63 within the filter 60. That is to say, step S21 also includes the first control process.

Subsequently, the controller 100 performs the first backwash control (the second control process). For example, the controller 100 performs steps S22 to S24.

In step S22, the first backwash control part 112 controls the processing solution supply part 30 to initiate the flow of the processing solution from the second space 62 to the first space 61 through the filtering member 63 by discharging the processing solution stored in the solution storage chamber 51. For example, the first backwash control part 112 controls the pump 50 to discharge the processing solution stored in the solution storage chamber 51 with the flow path switching valve V21 closed, the flow path switching valve V22 closed, the solution drain valve V31 closed, the outlet valve V2 and the circulation valve V3 closed, and the inlet valve V1 opened. Therefore, the second space 62 of the filter 60 is pressurized through the solution transfer pipe L1, and thus the processing solution flows from the second space 62 to the first space 61 through the filtering member 63. As a result, the first space 61 is also pressurized.

In step S23, the first backwash control part 112 stands by until the internal pressure of the first space 61 with the processing solution stored therein reaches a second threshold value or more. The second threshold value can be appropriately set by a previously presented condition or simulation in terms of forming a flow suitable for cleaning the filter 60. Furthermore, in step S23, the first backwash control part 112 may stand by until the internal pressure of the second space 62 with the processing solution stored therein reaches a predetermined threshold value or more.

In step S24, the first backwash control part 112 controls the processing solution supply part 30 to drain the processing solution introduced into the first space 61 from the second space 62 through the filtering member 63. For example, the first backwash control part 112 opens the solution drain valve V31 to initiate draining the processing solution through the solution drain pipe L4. Accordingly, the processing solution continues to flow from the second space 62 to the first space 61 through the filtering member 63.

Subsequently, the controller 100 performs step S25. In step S25, the second backwash control part 113 controls the processing solution supply part 30 to initiate pressurizing the processing solution using the pressurizing part 80. For example, the second backwash control part 113 opens the pressurization valve V12 with the flow path switching valves V21 and V22 closed.

Subsequently, when the internal pressure of the second space 62 is lower than the internal pressure of the tank 40, the controller 100 changes the first backwash control (the second control process) into the second backwash control (the third control process). For example, the controller 100 performs steps S26 to S28.

In step S26, the first backwash control part 112 controls the processing solution supply part 30 to stop the flow of the processing solution from the second space 62 to the first space 61 through the filtering member 63 by the pump 50. For example, the first backwash control part 112 controls the pump 50 to stop the discharge of the processing solution out of the solution storage chamber 51 and closes the inlet valve V1.

In step S27, the second backwash control part 113 stands by until the internal pressure of the second space 62 is lower than the internal pressure of the tank 40. Whether the internal pressure of the second space 62 is lower than the internal pressure of the tank 40 may be determined based on whether a detection value obtained by the pressure sensor PS2 is less than a set value for the internal pressure of the tank 40. If it is determined that the detection value obtained by the pressure sensor PS2 is less than the set value for the internal pressure of the tank 40, the controller 100 performs step S28 where the second backwash control is initiated.

In step S28, the second backwash control part 113 controls the processing solution supply part 30 to open the flow path going through the solution transfer pipe L2 (the second conduit). For example, the second backwash control part 113 opens the flow path switching valve V22. When the flow path switching valve V22 is opened, the processing solution pressurized by the pressurizing part 80 flows from the tank 40 to the trap 70 through the solution transfer pipe L2 and then flows into the second space 62 via the trap 70. Accordingly, the processing solution flows from the second space 62 to the first space 61 through the filtering member 63.

Subsequently, the controller 100 performs step S29. In step S29, the second backwash control part 113 stands by for a predetermined period of time. The predetermined period of time can be appropriately set by a previously represented condition or simulation in terms of sufficiently cleaning the filter 60.

Subsequently, the controller 100 performs step S30. In step S30, the second backwash control part 113 controls the processing solution supply part 30 to close the flow path going through the solution transfer pipe L2 (the second conduit) and stops drainage of the processing solution out of the first space 61. For example, the second backwash control part 113 closes the flow path switching valve V22 and closes the solution drain valve V31. In this way, the cleaning procedure of the filter 60 is completed.

Further, the above-described procedure is just one example, and appropriate modifications can be made. For example, step S25 may be performed at any timing after step S22 and before step S27.

(Filter Start-Up Procedure)

After the filtering member 63 of the filter 60 is replaced with a new one and before the processing solution supply control is initially performed, the processing solution supply part 30 performs impregnating the new filtering member 63 with a processing solution. The impregnation of the filtering member 63 with the processing solution is referred to as "wetting the filter 60." The wetting the filter 60 up to a level at which the filter 60 can be used for substrate process is referred to as "start-up of the filter 60." Hereinafter, a start-up procedure of the filter 60 will be described. This procedure is executed after the filtering member 63 of the filter 60 is replaced with a new one and before step S01 is initially performed.

Figure 10:
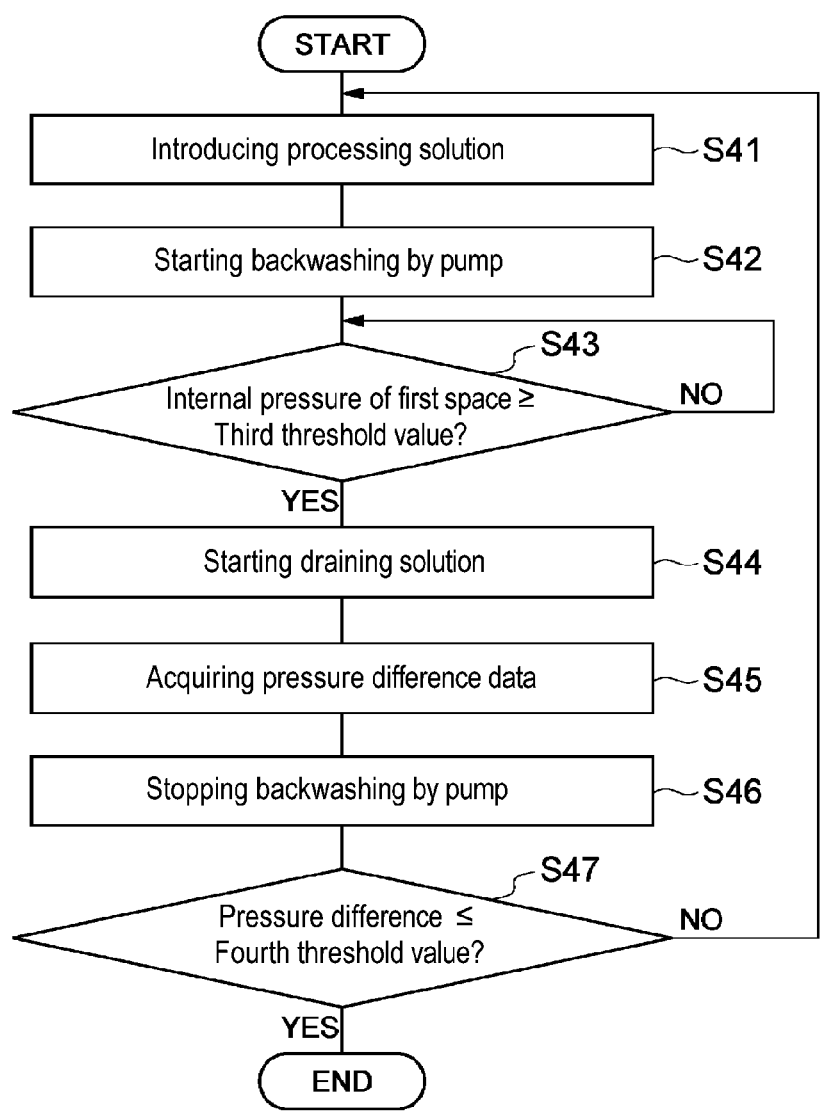
FIG. 10 is a flowchart illustrating a filter start-up procedure.

As illustrated in FIG. 10, the controller 100 performs step S41 first. In step S41, the start-up control part 114 allows a processing solution to flow from the tank 40 to the pump 50 through the solution transfer pipe L2 (without going through the filter 60) by introducing the processing solution into the solution storage chamber 51 of the pump 50. For example, the start-up control part 114 controls the pump 50 to introduce the processing solution into the solution storage chamber 51 with the flow path switching valve V21 closed, the flow path switching valve V22 opened, the solution drain valve V31 closed, the outlet valve V2 and the circulation valve V3 closed, and the inlet valve V1 opened. Accordingly, the processing solution flows from the tank 40 to the pump 50 through the solution transfer pipe L2.

Subsequently, the controller 100 performs step S42. In step S42, the start-up control part 114 controls the processing solution supply part 30 to discharge the processing solution stored in the solution storage chamber 51 to allow flow of the processing solution from the second space 62 to the first space 61 through the filtering member 63. For example, the start-up control part 114 controls the pump 50 to discharge the processing solution stored in the solution storage chamber 51 with the flow path switching valve V21 closed, the flow path switching valve V22 closed, the solution drain valve V31 closed, the outlet valve V2 and the circulation valve V3 closed, and the inlet valve V1 opened. Accordingly, the second space 62 of the filter 60 is pressurized through the solution transfer pipe L1, and the processing solution flows from the second space 62 to the first space 61 through the filtering member 63 so that the interior of the first space 61 is also pressurized. As a result, the filtering member 63 is impregnated with the processing solution from the second space 62.

Subsequently, the controller 100 performs step S43. In step S43, the start-up control part 114 stands by until the internal pressure of the first space 61 with the processing solution stored therein reaches a third threshold value or more. The third threshold value can be appropriately set by a previously presented condition or simulation in terms of forming a flow suitable for the start-up of the filter 60. The third threshold value may be identical to the second threshold value.

Subsequently, the controller 100 performs step S44. In step S44, the start-up control part 114 controls the processing solution supply part 30 to discharge the processing solution introduced into the first space 61 from the second space 62 through the filtering member 63. For example, the start-up control part 114 opens the solution drain valve V31 to initiate the discharge of the processing solution through the solution drain pipe L4. Accordingly, the processing solution continues to flow from the second space 62 to the first space 61 through the filtering member 63.

Subsequently, the controller 100 performs step S45. In step S45, the start-up control part 114 acquires a pressure difference data as in step S03.

Subsequently, the controller 100 performs step S46. In step S46, the start-up control part 114 controls the processing solution supply part 30 to stop the flow of the processing solution from the second space 62 to the first space 61 through the filtering member 63 by the pump 50. For example, the start-up control part 114 controls the pump 50 to stop the discharge of the processing solution out of the solution storage chamber 51.

Subsequently, the controller 100 performs step S47. In step S47, the controller 100 determines whether the pressure difference data (hereinafter, referred to as the "pressure difference") acquired in step S45 is less than or equal to a fourth threshold value. The fourth threshold value has been set in advance based on the correlation between the pressure difference and the degree to which the filter 60 has been wet. The correlation can be obtained by experiments, simulations, or the like.

If it is determined in step S47 that the pressure difference is greater than the fourth threshold value, the controller 100 returns to step S41. Thereafter, until the pressure difference is less than or equal to the fourth threshold value, the process of flowing the processing solution from the tank 40 to the pump 50 through the solution transfer pipe L2 and the process of flowing the processing solution from the second space 62 to the first space 61 through the filtering member 63 are repeated.

If it is determined in step S47 that the pressure difference is less than or equal to the fourth threshold value, the controller 100 completes the start-up procedure for the filter 60.

The above-described procedure is just one example, and appropriate modifications can be made. In some embodiments, the controller 100 may be configured to further perform, after the fourth control process and before the first control process, a fifth control process of controlling the processing solution supply part 30 to flow a processing solution from the first space 61 to the second space 62 through the filtering member 63 by the pump 50. That is to say, the start-up control may further include the fifth control process after the fourth control process. For example, after steps S41 to S47, the start-up control part 114 may further control the processing solution supply part 30 to flow a processing solution from the tank 40 to the pump 50 through the filter 60 by introducing the processing solution into the solution storage chamber 51 of the pump 50. More specifically, after steps S41 to S47 described above, the start-up control part 114 may control the pump 50 to introduce the processing solution into the solution storage chamber 51 with the flow path switching valve V21 opened, the flow path switching valve V22 closed, the solution drain valve V31 closed, the outlet valve V2 and the circulation valve V3 closed, and the inlet valve V1 opened.

Effects of Present Embodiment

As described above, the coating/developing apparatus 2 includes the nozzle 22 configured to discharge a processing solution, the processing solution supply part 30 configured to supply the processing solution to the nozzle 22, and the controller 100. The processing solution supply part 30 includes the tank 40 configured to receive the processing solution, the solution transfer pipe L1 for guiding the processing solution from the tank 40 to the nozzle 22, the pump 50 installed in the solution transfer pipe L1, and the filter 60 installed in the solution transfer pipe L1 between the tank 40 and the pump 50 and having the first space 61 defined at the side of the tank 40, the second space 62 defined at the side of the pump 50, and the filtering member 63 configured to separate the first space 61 and the second space 62. The controller 100 is configured to perform the first control process of controlling the processing solution supply part 30 to allow flow of the processing solution from the first space 61 to the second space 62 through the filtering member 63 by the pump 50, and after the first control process, the second control process of controlling the processing solution supply part 30 to flow the processing solution from the second space 62 to the first space 61 through the filtering member 63 by the pump 50.

The controller 100 performs the first control process so that particles in the processing solution are trapped at the side of the filtering member 63 defined in the first space 61. Due to this, if only the first control process is continually performed, the particles are accumulated at the side of the filtering member 63 defined in the first space, which may cause clogging of the filter 60. The clogging of the filter 60 refers to a state in which a flow-rate reduction caused by the particles accumulated on the filtering member 63 is not allowable. To address this, the controller 100 is configured to perform the second control process. By the second control process performed by the controller 100, the processing solution flows from the second space 62 to the first space 61 through the filtering member 63 so that at least a portion of the particles accumulated at the side of the filtering member 63 defined in the first space 61 is separated from the filtering member 63. Accordingly, the accumulation of the particles at the side of the filtering member 63 defined in the first space 61 is alleviated. As a result, it is possible to effectively suppress the clogging of the filter 60.

The second control process may include discharging the processing solution introduced into the first space 61 from the second space 62 through the filtering member 63 with an increase in the internal pressure of the filter 60. The processing solution introduced into the first space 61 from the second space 62 through the filtering member 63 contains particles separated from the filtering member 63. By discharging the processing solution, it is possible to prevent the particles separated from the filtering member 63 from being accumulated on the filtering member 63 again. As a result, it is possible to further effectively suppress the clogging of the filter 60.

The controller 100 may be configured to initiate the second control process with an increase in the difference between the internal pressure of the first space 61 and the internal pressure of the second space 62. The difference between the internal pressure of the first space 61 and the internal pressure of the second space 62 (hereinafter, referred to as the "pressure difference") increases as particles accumulated on the filtering member 63 (hereinafter, referred to as "accumulated particles") increase. Thus, by initiating the second control process with an increase in the pressure difference, it is possible to change the first control process into the second control process with an increase in the accumulated particles. The accumulated particles can be effectively separated from the filtering member 63 by changing the first control process into the second control process with the increase in the accumulated particles. As a result, it is possible to further effectively suppress the clogging of the filter 60.

The processing solution supply part 30 may further include the pressurizing part 80 configured to pressurize the processing solution stored in the tank 40 toward the pump 50 and the solution transfer pipe L2 connecting the first space 61 and the second space 62 while bypassing the filtering member 63. The controller 100 may be configured to further perform, after the processing solution flows from the second space 62 to the first space 61 through the filtering member 63 under the second control process, the third control process of controlling the processing solution supply part 30 to guide the processing solution pressurized by the pressurizing part 80 to the second space 62 through the solution transfer pipe L2 and allow flow of the processing solution from the second space 62 to the first space 61 through the filtering member 63. In this case, by performing the third control process, it is possible to continuously allow flow of the processing solution from the second space 62 to the first space 61 even after the execution of the second control process, thus cleaning particles. As a result, it is possible to further effectively suppress the clogging of the filter 60.

The third control process may include controlling the processing solution supply part 30 to open the flow path of the processing solution through the solution transfer pipe L2 when the internal pressure of the second space 62 is lower than the internal pressure of the tank 40. In this case, the flow of the processing solution from the second space 62 to the first space 61 can be rapidly formed after the execution of the third control process. As a result, it is possible to further effectively suppress the clogging of the filter 60.

Moreover, the controller 100 may be configured to further perform, before the first control process, the fourth control process of controlling the processing solution supply part 30 to allow flow of the processing solution from the second space 62 to the first space 61 through the filtering member 63 by the pump 50. In the start-up of the filter 60, particles may be generated from the filtering member 63. According to the fourth control process, particles may be generated at the side of the first space 61 by directing the processing solution from the second space 62 to the first space 61 in the start-up of the filter 60. Accordingly, it is possible to prevent the particles from moving toward the nozzle 22.

Moreover, the controller 100 may be configured to complete the fourth control process with a decrease in the difference between the internal pressure of the first space 61 and the internal pressure of the second space 62. The difference (the pressure difference) between the internal pressure of the first space 61 and the internal pressure of the second space 62 decreases as the filter 60 is gradually wetted. It is therefore possible to sufficiently wet the filter 60 by continually performing the fourth control process until the pressure difference starts to decrease. Accordingly, it is possible to enhance the availability of the filtering member 63 at the initiation of the first control process and to prevent bubbles from being generated from the filtering member 63.

Moreover, the controller 100 may be configured to further perform, after the fourth control process and before the first control process, the fifth control process of controlling the processing solution supply part 30 to allow flow of the processing solution from the first space 61 to the second space 62 through the filtering member 63 by the pump 50. In this case, it is possible to rapidly complete the start-up of the filter 60 by performing the fourth and fifth control process together.

In this embodiment, the pressure sensors PS1 and PS2 are used for multiple purposes. Specifically, detection results obtained by the pressure sensors PS1 and PS2 are used to: determine whether the filter 60 needs to be cleaned, in step S13; adjust a timing at which the processing solution is initiated, in step S23; adjust a timing at which the second backwash control (the third control process) is initiated, in step S27; adjust a timing at which the discharge of the processing solution is initiated, in step S43; and adjust a timing at which the start-up control (the fourth control process) is completed. As described above, by installing a sensor configured to detect pressure correlated with the internal pressure of at least one of the first and second spaces 61 and 62 of the filter 60, it is possible to use the information detected by the respective sensor in order to determine various conditions. Furthermore, the use of a common sensor for multiple purposes contributes to suppress the configuration of the apparatus from being complicated and to enhance the performance thereof (suppressing the clogging of the filter 60 and reducing the start-up time of the filter 60).

Although the embodiment has been described, the present disclosure is not necessarily limited to the above-described embodiment, and various modifications can be made without departing from the spirit and the scope of the present disclosure. As an example, while in the above embodiment, the processing solution supply procedure, the filter cleaning procedure, and the filter start-up procedure has been described to be applied to the solution processing units U1 of the processing module 15, these procedures can also be applied to the solution processing units U1 of the processing modules 14, 16, and 17. Furthermore, a substrate to be processed may be, for example, a glass substrate, a mask substrate, a flat panel display (FPD), or the like, without being limited to a semiconductor wafer.

According to the present disclosure, it is possible to have a substrate processing apparatus, a substrate processing method, and a recording medium, which are effective in suppressing the clogging of a filter caused by a processing solution.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate by a substrate processing apparatus that includes:
    a nozzle configured to discharge a processing solution; and
    a processing solution supplier configured to supply the processing solution to the nozzle and including:
        a tank in which the processing solution is received;
        a first conduit configured to guide the processing solution from the tank to the nozzle;
        a pump installed in the first conduit;
        a filter installed in the first conduit between the tank and the pump, and having a first space defined at a side of the tank, a second space defined at a side of the pump and a filtering member configured to separate between the first space and the second space; and
        a plurality of pressure sensors configured to sense an internal pressure of the first space and an internal pressure of the second space,
    wherein the method comprises:
        performing a first control process to supply the processing solution from the first space to the second space through the filtering member by the pump; and
        following the first control process, performing a second control process to direct the processing solution from the second space to the first space through the filtering member by the pump.

2. The method of claim 1, wherein the second control process is initiated by an increase in a difference between the internal pressure of the first space and the internal pressure of the second space.

3. The method of claim 1, wherein the second control process includes discharging the process solution, which has been introduced from the second space into the first space through the filtering member, from the first space toward a solution drain pipe when the internal pressure of the first space reaches a predetermined threshold.

4. The method of claim 1, wherein the substrate processing apparatus further comprises:
    a first flow path switching valve installed between the tank and the filter in the first conduit; and
    a second flow path switching valve installed in a second conduit.

5. The method of claim 4, wherein the first control process is performed by controlling:
    the first flow path switching valve to be opened; and
    the second flow path switching valve to be closed.

6. The method of claim 4, wherein the second control process is performed by controlling:
    the first flow path switching valve to be closed; and
    the second flow path switching valve to be closed.

7. The method of claim 1, wherein the second control process allows particles accumulated at a side of the filtering member in the first space to be separated from the filtering member.

8. The method of claim 1, wherein the processing solution supplier further includes:
    a pressurizer configured to pressurize the processing solution received in the tank toward the pump; and
    a second conduit connected between the first space and the second space while bypassing the filtering member, and
    wherein the method further comprises, following the second control process, performing a third control process to guide the processing solution pressurized by the pressurizer to the second space through the second conduit so that the processing solution flows from the second space to the first space through the filtering member.

9. The method of claim 8, wherein the third control process allows the processing solution from the second space to be directed to the first space through the filtering member to open a flow path of the processing solution through the second conduit when the internal pressure of the second space is lower than an internal pressure of the tank.

10. The method of claim 1, further comprising: before the first control process, performing a fourth control process to supply the processing solution from the second space to the first space through the filtering member by the pump.

11. The method of claim 10, further comprising: completing the fourth control process by a decrease in a difference between the internal pressure of the first space and the internal pressure of the second space.

12. The method of claim 10, further comprising: after the fourth control process and before the first control process, performing a fifth control process to supply the processing solution from the first space to the second space through the filtering member by the pump.

\* \* \* \* \*